United States Patent [19]

Purwin et al.

[11] 4,259,122

[45] Mar. 31, 1981

[54] SELENIUM PHOTOVOLTAIC DEVICE

[75] Inventors: Paul E. Purwin, Watchung; Robert F. Shaw, Chatham, both of N.J.

[73] Assignee: Exxon Research and Engineering Co., Florham Park, N.J.

[21] Appl. No.: 72,405

[22] Filed: Sep. 4, 1979

Related U.S. Application Data

[63] Continuation-in-part of Ser. No. 967,626, Dec. 8, 1978, abandoned.

[51] Int. Cl.³ .............................................. H01L 31/04
[52] U.S. Cl. .................................. 136/258; 136/264; 357/11; 357/16; 357/30; 427/76
[58] Field of Search ...................... 136/89 ST, 89 TF; 357/11, 16, 30; 250/211 R, 211 J, 21 Z; 427/76

[56] References Cited

U.S. PATENT DOCUMENTS

| 3,990,095 | 11/1976 | Busanovich et al. | 357/15 |
| 4,064,522 | 12/1977 | Shaw et al. | 357/16 |

*Primary Examiner*—Aaron Weisstuch
*Attorney, Agent, or Firm*—Paul E. Purwin

[57] ABSTRACT

A high efficiency selenium photovoltaic solar cell comprises a transparent base; a pellucid layer of conductive oxide; a layer of polycrystalline selenium forming a heterojunction to the underlying oxide; a thin layer of tellurium interposed between the oxide and selenium layers providing a metallurgical bond therebetween; a layer of high work function metal forming an ohmic contact to the selenium layer. A process of optimizing the optical and electrical characteristic of each component of the solar cell results in increased sunlight engineering efficiencies in excess of about 3.5%.

16 Claims, 3 Drawing Figures

SELENIUM PHOTOVOLTAIC DEVICE

CROSS-REFERENCE TO RELATED APPLICATIONS

This application is a continuation-in-part of Ser. No. 967,626, filed Dec. 8, 1978, abandoned.

FIELD OF THE INVENTION

The present invention relates to photovoltaic cells and more particularly to polycrystalline selenium cells having sunlight conversion efficiencies in excess of about 3.5%.

Photovoltaic devices such as silicon solar cells, well known in the art, are capable of converting photon energy into electrical energy. A figure of merit defining a photovoltaic devices' ability to convert incident sunlight energy into electricity is generally referred to as sunlight or air mass 1 engineering efficiency. This figure, to those of the art, represents a standardized basis of comparison of photovoltaic devices. The figure represents the net power output of a photovoltaic device when irradiated with a solar spectrum equivalent of 100 mw/cm$^2$.

Silicon single crystal wafer cells, presently obtaining a maximum efficiency of about 15%, are capable of producing electricity at a cost of roughly 100 times that of conventional methods. The principal portion of the cost is attributed to the production of the semiconductor material itself. A promising alternative to single crystal wafers is thin film semiconductors which can be produced at substantially reduced costs relative to silicon.

Based upon the band gap of hexagonal selenium, it has been calculated that the sunlight efficiency of a selenium thin film photovoltaic cell could be as high as 20%; ref. J. J. Loferski, Recent Research on Photovoltaic Solar Energy Converters, Proceedings of the IEEE, 51 (1963), p 667–674. These figures assume a collection of all carriers generated. In an actual application sunlight efficiency falls far short of this figure due to the electrical characteristics inherent to the semiconductor material. Commercially available selenium cells presently display sunlight engineering efficiencies of less than about 1%.

The electrical characteristics of trigonal or hexagonal selenium vary considerably dependent upon the amount of extrinsic dopants either inadvertently or intentionally incorporated into the material. For example, Eckart et al in Annotated Physics 17, 84 (1956), notes that the resistivity in trigonal selenium will vary from $10^5 \Omega$-cm to $10^9 \Omega$-cm dependent upon oxygen content. Extrinsic dopants such as Te, Br and Th are also known to alter selenium's resistivity by several orders of magnitude. In general, the tailoring of the electrical characteristics is important to producing an efficient photoconductive device. In the photovoltaic application of selenium, such tailoring is of critical importance to improving efficiency. Minority carriers in selenium have an extremely low drift mobility generally attributed to a high trappping probability, and thereby the diffusion length of sunlight generated carriers is correspondingly low. The resultant effect upon a photovoltaic device comprised of selenium is that only the carriers which are generated in the immediate field or barrier region will be collected. Those carriers generated outside that region will recombine and be lost. Furthermore, the semiconductor material not within the field region will result in an internal dissipative load to the photovoltaic device, further degrading its efficiency. A means for improving the collection of carriers would entail either applying a reverse bias to the photovoltaic junction, as is employed in photosensitive rectifiers, or alternatively altering the semiconductor itself to both increase the width of the barrier collection region and decrease the internal dissipative load to increase device efficiency. An object of the present invention is a selenium device whose semiconductor properties are tailored to produce a high efficiency photovoltaic device.

PRIOR ART

Previous efforts at utilizing selenium in a thin film photoconductor have been directed toward photosensitive rectifying devices. One such device, for example, is disclosed by Busanovich in U.S. Pat. No. 3,990,095. The design parameters for an efficient solar photovoltaic device and a photosensitive rectifier device differ substantially. Rectifiers do not rely upon the width of the internally created barrier collection region since the application of an external bias is contemplated in their operation. The tailoring of semiconductor electrical characteristics such as series resistance (internal load dissipation), optimization of sunlight absorption within the barrier region, the ohmicity of current collecting electrodes and other electrical and optical properties necessary to the production of efficient sunlight converters are of perfunctory concern in the design of such rectifiers. The foregoing is evidenced by the graphic description (FIG. 3 of U.S. Pat. No. 3,990,095) of the diode characteristics of the prior art device. By means of comparison, an efficient photovoltaic cell, as produced by this invention, displays a forward bias current density of about 12 mA/cm$^2$ at 0.6 volts whereas the prior art devices are shown to be less than about 2 mA/cm$^2$.

An attempt to produce an efficient photovoltaic solar converter is disclosed by R. Shaw in U.S. Pat. No. 4,064,522 wherein a metal substrate with a layer of P type polycrystalline selenium forms a heterojunction with N-type cadmium selenide and further with an N+ layer of cadmium oxide. The present device utilizes no known layer of cadmium chalcogenide in the heterostructure formation. The prior art also employs a metallurgical bonding layer of tellurium in excess of 50 Å. Such higher levels of tellurium would significantly degrade the efficiency of the present invention.

In general, the prior art discloses the use of polycrystalline selenium as a photosensitive rectifier whose electronic characteristics are significantly different from the proposed invention. Prior photovoltaic applications are clearly different in composition, which differences are contrary to the present teachings.

SUMMARY OF THE INVENTION

Generally speaking, the present invention contemplates an improved thin film selenium photovoltaic device, capable of producing a sunlight engineering efficiency in excess of about 3.5%. The device comprises a transparent base; a pellucid layer of conductive oxide whose surface layer has a work function below about 4.5 electron volts; a continuous layer of polycrystalline selenium forming a heterojunction to the underlying oxide; a thin, electrically discontinuous layer of tellurium interposed between said oxide and selenium layers providing a metallurgical bond therebetween;

and a layer of high work function metal such as platinum forming an ohmic contact to said selenium layer.

DETAILED DESCRIPTION OF THE INVENTION

Figure 1:
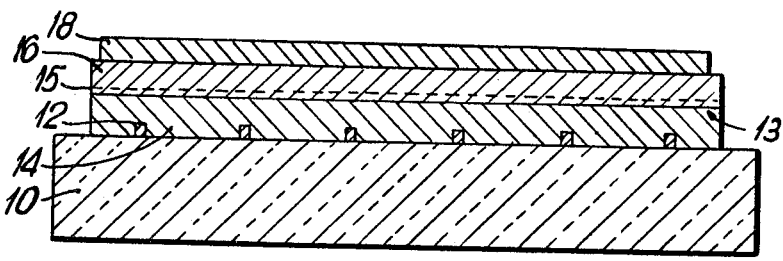
FIG. 1 is a cross-sectional view of a simplified representation of a photovoltaic cell produced in accordance with this invention.

The present invention relates to thin film polycrystalline selenium devices producing sunlight engineering efficiencies in excess of about 3.5%. Referring now to FIG. 1, the device comprises a transparent supportive substrate (10) coated with a pellucid layer of an electrically conductive oxide (14) whose surface work function is below about 4.5 electron volts: a metallic grid (12) may be interposed to increase the conductivity of the conductive oxide; a thin, continuous layer of P type polycrystalline selenium (16) forming a heterojunction to said oxide upon contacting same; a thin, electrically discontinuous layer of tellurium (15) interposed between said oxide and selenium layers providing a metallurgical bond therebetween a layer of high work function metal (18) such as platinum, contiguous with the selenium layer, providing an ohmic contact to the semiconductor.

The important aspects of producing an efficient thin film selenium photovoltaic device are: providing a selenium layer of appropriate thickness to minimize the bulk series resistance of the device yet ensure electrical continuity of the entire selenium layer: selectively altering the intrinsic electrical characteristics of the selenium layer to maximize the barrier or depletion width while minimizing the electrical resistivity of the bulk semiconductor; ensuring an ohmic contact to the semiconductor material or alternatively forming a complementary junction as a current carrying electrode; optically matching the transparent and semi-transparent layers, maximizing their antireflection properties; and maximizing the amount of light reaching the electrically active junction region.

Referring again to FIG. 1, the transparent base (10) is comprised of glass, sapphire, quartz, or any highly transparent, physically supportive material capable of withstanding the processing temperatures of the overlying layers. The term withstanding requires a permanence of surface microstructure along with the body macrostructure so as to prevent damage to the overlying thin films or inconsistencies in the formation of the overlying thin films. Furthermore, the transparent base must be stabilized to the anticipated continuous exposure to ultraviolet and other solar radiation. Stabilization generally refers to chemical and physical integrity and specifically here concerns the permanence of the transparency of the base. In a preferred embodiment, a borosilicate glass substrate maintains a transparency of greater than 93% throughout the portion of the solar spectrum utilized by the photovoltaic device. It further contains a minimal amount of diffusable material which may migrate into the semiconductor layers to their disadvantage. The thermal expansion properties are similarly sufficient to withstand the processing steps of the overlying layers, which steps include heat treatments of the selenium layer in excess of about 200° C. A thin film photovoltaic device is highly suscetible to physical microstructure inconsistencies of the order of about 1 micron or greater. A diminutive fault may deteriorate the performance of the entire device and all further devices electrically connected to it. Furthermore, in a layered device such as the present invention, each proceeding layer is dependent upon the integrity of all preceding layers. Therefore, in a preferred embodiment, the base is capable of and is subjected to a scrupulous cleaning of the surface to be coated to insure a microscopically clean surface.

The transparent base is coated with a high conductive ($\leq 10\Omega$/square) highly transparent (>90% throughout the usable solar spectrum) oxide (14), the formation of which is known in the art. Conductive oxides, suitable for use in the present invention, include tin oxide, indium tin oxide, arsenic tin oxide, cadmium oxide, cadmium stannate or mixtures thereof. Relative to the size of each photovoltaic device, the conductive oxide may be an insufficiently conductive electrode adding to the total internal series resistance of the cell. To accommodate large area devices, a metallic grid (12) network may be interposed among the oxide layer. This grid may further serve to interconnect separate devices. The design of the grid network may be optimized using conventional mathematical techniques to minimize area coverage and series resistance of the grid/oxide electrode, maximizing device efficiency.

The surface of the oxide comprises a region of material having a work function less than about 4.5 electron volts. This is done by either depositing a thin oxide layer onto a degenerate oxide, or, during the forming of the degenerate oxide, tailoring the oxygen deficiency of the surface region (13) to increase the oxygen to metal ratio. This is accomplished by any of a number of techniques; for example, heat treatment in an oxygen rich atmosphere after the electron beam deposition of tin or indium tin oxide; in the sputter formation of oxides, by controlling the oxygen content of the sputtering gases; in the thermal decomposition of tin or indium tin chloride, by providing a high humidity ambient; or any similar technique to provide a surface having a low work function.

Figure 2:
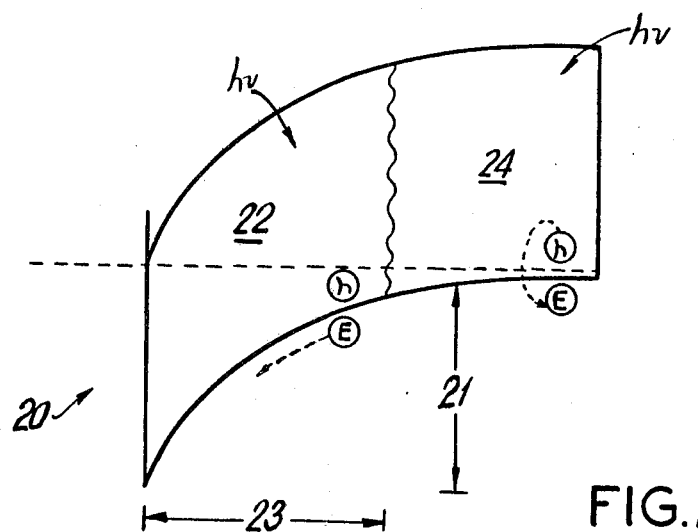
FIG. 2 diagrammatically illustrates the energy relationship internal to the photovoltaic device of this invention.

Referring momentarily to FIG. 2, the work function of the surface region of the oxide layer (20) will dictate the electronic band bending (21) within the selenium semiconductor. This value of band bending (21) is determinative of the achievable open circuit voltage produced by the photovoltaic device upon irradiation. Thereby, in a preferred embodiment, the oxide surface will have a low work function, 4.2 for example, producing a high open circuit voltage of approximately 0.76 volts.

The thickness of the oxide layer and the transparent supportive substrate together are controlled to provide an effective anti-reflection coating for the selenium layer. This reduces the reflection of light to less than about 10%.

Alternatives to conductive oxides such as semitransparent metal coating of aluminium containing a thin oxide coating have proven disadvantageous due to the transmission versus resistance ratios for such films. A nominally conductive film of aluminum permits only about 50% of the light to reach the semi-conductor. Films sufficiently conductive so as not to appreciably add to the internal series resistance of the device would allow less than about 10% of the incident light to reach the semi-conductor.

A thin, electrically discontinuous film of tellurium is either vapor or sputter deposited onto the oxide coated substrate to provide a metallurgical bond between the oxide and selenium layers. The thickness of the layer is critical to both the physical integrity and the electrical performance of the device. In accordance with this invention, a uniformly deposited film of 15–50 Å of tellurium will produce an efficient photovoltaic device, however, a maximum efficiency, and thereby a preferred embodiment is achieved employing an effective layer of 15 Å of tellurium. In the vapor deposition of other metals such as gold and silver, where the nucleation and growth of films less than 50 Å has been observed, it is known that a rapid (10 Å/second) deposition onto a cool (27° C. or below) substrate results in a more uniform dispersion of the initial layer. To assure a uniform dispersion of the effective level of tellurium, a preferred deposition of tellurium is carried out at a rate of about 10 Å/second onto a substrate cooled to a temperature of about 20° C.

An alternative to interposing a thin layer of tellurium between the selenium and the oxide is to disperse a similar amount of tellurium throughout the selenium film. For example, depositing 5 Å tellurium followed by one micron of selenium and repeating this sequence twice more. As a further alternative, tellurium may be co-deposited at a rate proportional to the selenium deposition such that a total of 15 Å of tellurium is deposited throughout the selenium film.

The selenium layer is formed by initially depositing a layer of amorphous selenium. In one embodiment the source selenium is treated prior to deposition to remove oxygen by means of vacuum distillation or similar oxygen removal techniques. Since oxygen readily dissolves into selenium in a molten state, removal of oxygen such as to effect a reduction of selenium's conductivity from $10^{+5}$ ohm-cm to $10^{+8}$ ohm-cm requires that the distillation be performed at low oxygen pressures, i.e. a vacuum of $10^{-7}$ torr or better. Alternatively, the oxygen-rich selenium may be segregated from the oxygen deficient selenium during the vacuum distillation process by flash freezing the molten distillate of selenium in liquid nitrogen. The exterior hardened selenium will be oxygen-rich while the central portions remain oxygen deficient. A simple resistivity test confirms the effectiveness of the oxygen removal process.

The vacuum deposited amorphous selenium layer is typically less than about 5 microns in thickness. Selenium layers less than 1 micron in thickness have been shown as operative in the present invention; however, preparation of the underlying layers must be scrutinized to avoid discontinuities in the subsequently deposited selenium layer. These discontinuities manifest in electrical shorting paths through the heterojunction, generally reducing the efficiency of the device.

A selenium layer thickness of the range of about one to about five microns provides a sufficiently continuous film yet minimizing the internal series resistance of the device. In a preferred embodiment, a selenium layer between 2 and 3 microns in thickness, provides sufficient film continuity to maximize the current generators shunting resistance while minimizing the non-contributive bulk semiconductor resistance, resulting in a more efficient photovoltaic device.

The amorphous selenium film is heat treated to crystallize the selenium at a temperature just below the melting temperature of selenium. Typically, the amorphous film is heat treated at a temperature between about 200° C. and about 210° C. for a period between about 2 and about 10 minutes. The heating causes essentially complete crystallization of the amorphous layer. In one embodiment, the crystallized selenium is thereafter cooled to about 20° in a time period between about 30 seconds and about 10 minutes.

To produce a high efficiency selenium photovoltaic cell, it is advantageous to have the internal field, which is created upon contacting the selenium to the low work function oxide, extend as deep as possible into the selenium layer. The present invention teaches a selenium heterojunction device having a depletion region which extends inwardly into the selenium layer from the heterojunction in excess of about 1,000 Angstroms. It is of further advantage to render any selenium material outside this field region as conductive as possible. It is believed that the deoxidized selenium inherently possess a fewer number of free charge carriers, causing the field region to extend deeper into the selenium layer. It is further believed that the rapid recrystallization process at temperatures near the melting point of selenium provides a favorable crystalline morphology, allowing the depletion region to extend substantially further into the selenium layer. The rapid recrystallization is recognized to concurrently provide infusion of oxygen into the bulk region (24) of the selenium layer, making it less resistive. As described heretofore, oxygen is believed to act as a doping agent, increasing the number of defect carriers and hence the conductivity in the bulk (non-barrier) selenium region. The rapid decrease in temperature controls the depth to which the oxygen or other extrinsic dopant diffuse into the selenium. Therefore, a field region (22) extends deep into the selenium while a conductive bulk region is achieved. An alternative to controlling the cooling rate of the selenium to affect the bulk conductivity comprises higher pressures of an oxygen-containing ambient or similarly doping the bulk region with appropriate levels of Te, Cl or Br, which are known to increase the conductivity of selenium. The barrier (field) region 22 may also be doped with thallium or a similarly compensating acceptor impurities.

A layer of platinum or similarly high work function material, contiguous to the selenium layer, serves as an ohmic contact to the selenium, providing a current collecting electrode. A layer of P+ material may be interposed between said ohmic contact and the selenium to provide a back junction electrode. Failure to provide a contact of sufficiently high work function, gold, for example, will increase the series resistance of the device reducing its efficiency.

Figure 3:
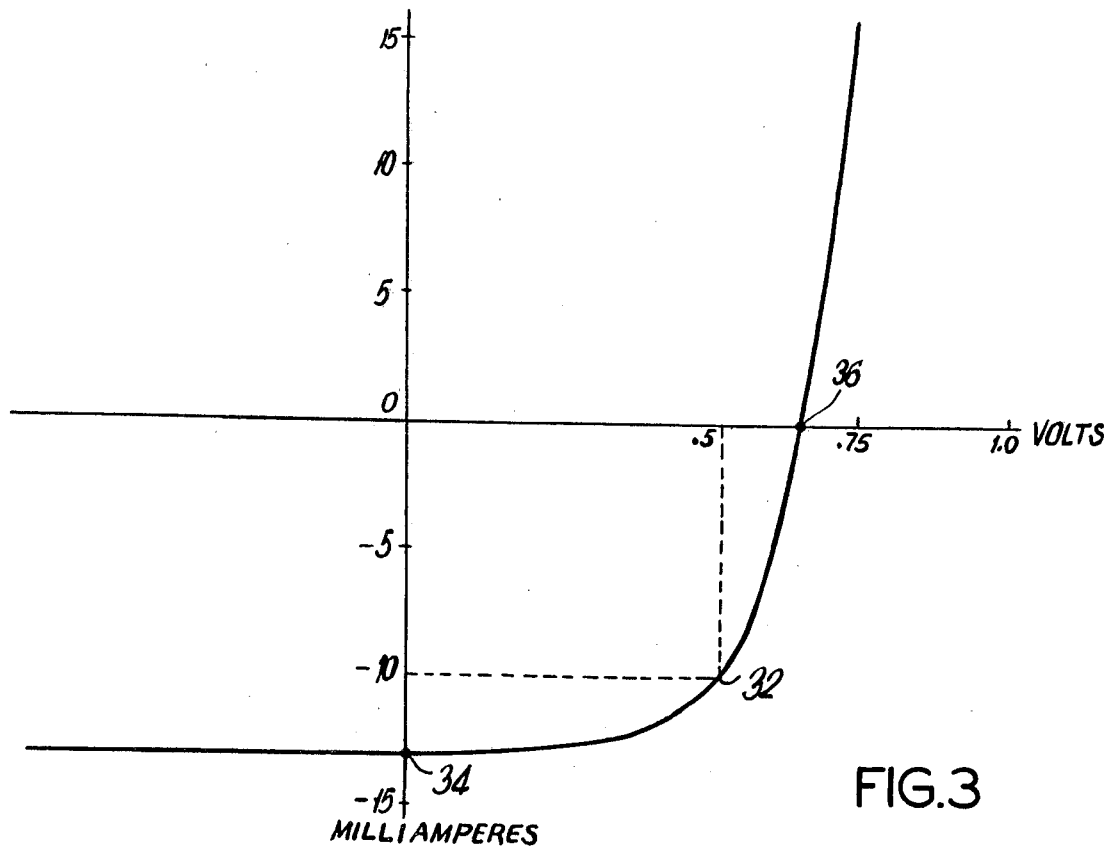
FIG. 3 is a power curve at air mass one (100 mw/cm$^2$) of a typical photovoltaic device produced by the invention, graphically displaying the invention's ability to efficiently convert sunlight energy into electricity.

Referring now to FIG. 3, a selenium photovoltaic device produced in accordance with the present invention, typically displays the sunlight power output characteristics (30) of a short circuit current (34) of about 13 mA/cm$^2$, an open circuit voltage of about (36) 0.65 volts and a maximum power (32) sunlight engineering efficiency in excess of 3.5%.

In order to give those skilled in the art a better understanding of the presentation invention, the following illustrative examples are given.

EXAMPLE 1

A layer of tin oxide is deposited onto a scrupulously cleaned borosilicate glass substrate by the conventional technique of thermally decomposing tin chloride. The surface was exposed to a high humidity atmosphere during the decomposition process. The optical and electrical properties of the deposited film are examined using a Cary 17 Spectrometer and a Kiethly four point probe, ensuring that the film maintains greater than 90% transmission throughout the spectral region from 200 nm to 800 nm with a resistivity of less than about 7 ohms per square centimeter. A value of 4.2 ev for the surface work function, relative to a platinum standard, is obtained using an Isoprobe Model No. 162. An amount of selenium is vacuum distilled by heating the material above its boiling point at a vacuum pressure of about $5 \times 10^{-8}$ torr. Alternatively, the selenium may be heated above its boiling point in a sealed quartz tube which is either evacuated or filled with a reducing gas such as hydrogen. The heated selenium is quickly quenched to less than about 20° C. to separate the deoxidized material which appears in the lower portion of the melt.

The oxide coated substrates are again scrupulously cleaned using both mechanical scrubbing and chemical cleaning and then placed into a conventional vacuum system capable of obtaining a vacuum of about $5 \times 10^{-8}$ torr. The system is equipped for programmable deposition rate control and automatic shuttering of the substrates from the deposition. A 15 Å layer of tellurium is deposited at a rate of about 10 Å/second. A 3 micron layer of selenium is deposited at an initial rate of about 100 Å/second for the first micron, 90 Å/second for the second micron and 70-80 Å/second for the final micron.

The film is transferred to a heat treatment chamber containing a heating platen maintained at 210° C. The films are placed on the heated platen for about 2 minutes, during which time the film color transforms from a glossy red surface to a matted gray finish, characteristic of polycrystalline selenium. The ambient is maintained at a temperature of less than about 60° C. during the recrystallizing process. After about 2 minutes at 210° C., the platen is cooled to about 20° C. in about a span of 30 seconds, which completes the recrystallizing process.

A layer of platinum is deposited onto the crystalline selenium by conventional techniques.

The sunlight engineering efficiency is obtained by evaluating the power curve, which is the ability of a photovoltaic device to deliver power to a load, while monitoring the incident sunlight with an Epply pyroheliometer. Evaluated at an irradiance of about 100 milliwatts, the device displayed a sunlight engineering efficiency of 4.0%, having a short circuit current of 13 mA/cm² and an open circuit voltage of 0.64 volts. The device was then subjected to barrier characterizing experiments which included a determination of the depletion width of the barrier formed by the heterojunction. This experiment, referred to in the art as "Capacitance-Voltage" measurements indicated a zero bias depletion width in excess of 5000 Angstroms. Additionally, the forward bias falloff of depletion width was noted as favorably minimal, retaining a depletion width of greater than 3000 Å at the maximum power point of the device.

The optical characteristics of the device were then examined using a Beckman spectrophotometer fitted with an integrating sphere for reflectance measurements. Referring momentarily to FIG. 1, the device's reflectance characteristics are obtained by illuminating through layers 10 and 14, which correspond to the reflective component experienced in the operation of the device as a solar cell. A reflectance of 8.5% was measured, which included an anticipated 4% from the glass/air interface.

EXAMPLE 2

The technique and procedure of constructing the selenium photovoltaic device of example 2 are essentially similar to Example 1 except that the conductive oxide is indium tin oxide, sputtered onto a borosilicate glass substrate at a temperature of about 150° C. A sunlight engineering efficiency of 3.52% was obtained in a measurement similar to that described in Example 1. An open circuit voltage of 0.58 volts and a short circuit current of 13 mA/cm² were recorded at a sunlight irradiance of about 92 mW/cm².

EXAMPLE 3

Generally, the procedure of Example 1 are followed, except that the conductive oxide comprises a layer of cadmium stannate.

EXAMPLE 4

By way of comparison, the technique and procedure of Example 1 are generally followed except that the tellurium layer is increased in thickness from 15-150 Å and the selenium layer is varied between 0.5 and 10 microns. Table I indicates the effect upon device performance and illustrates the importance of tailoring the properties of the semiconductor.

TABLE I

| Te Thickness | Se Thickness | Efficiency | Comments |
| --- | --- | --- | --- |
| 5 A | 3 | — | Film peeled |
| 15 A | 3 | 4.0% | |
| 40 A | 3 | 3.52% | |
| 75 A | 3 | 1.1% | Low Voltage |
| 150 A | 3 | .61% | Low Voltage and current |
| 15 A | .5 | 1.2% | Low Voltage |
| 15 A | 5 | 2% | Higher R Series |
| 15 A | 10 | — | Film peeled |

What is claimed is:

1. A photovoltaic device comprising a transparent supportive substrate coated with an electrode comprising of a pellucid layer of conductive oxide having a surface whose work function is below about 4.5 electron volts, a continuous layer of crystalline P-type selenium less than about five microns but sufficient in thickness to be substantially free of shorting paths therethrough and forming a heterojunction with said oxide, a thin layer of tellurium interposed between said oxide and selenium layers providing a metallurgical bond therebetween; an electrode consisting of a metal having a work function in excess of about 5.0 electron volts contiguous the selenium layer providing an ohmic contact thereto, said selenium layer having a depletion region extending inwardly from said heterojunction in excess of about 1000 Angstroms and having a deficiency of oxygen relative to said selenium proximate said ohmic contact wherein the device when illuminated with solar energy or the equivalent thereof of an intensity of about 100 milliwatts per centimeter squared displays a conversion efficiency in excess of about 3.5%.

2. The photovoltaic device described in claim 1 wherein the conductive oxide is selected from the group consisting of tin oxide, antimony tin oxide, arsenic tin oxide, indium tin oxide, cadmium oxide, cadmium stannate or a mixture thereof.

3. The photovoltaic device described in claim 2 wherein the oxide layer transmits greater than about 90% of the light wavelengths between 200 nanometers and 800 nanometers.

4. The photovoltaic device described in claim 2 wherein the conductive oxide layer is of a resistivity less than 10 ohms per square centimeter.

5. The photovoltaic device of claim 1 wherein the tellurium layer is 15–15 Å in thickness.

6. The photovoltaic device described in claim 1 wherein the tellurium layer is further characterized as an effective layer of 15 Å of tellurium.

7. The photovoltaic device described in claim 1 wherein the selenium layer is doped in the region proximate to the ohmic contact with at least one dopant selected from the group consisting of chlorine, tellurium and bromine.

8. The photovoltaic device described in claim 1 wherein the transparent base in conjunction with the pellucid oxide layer provide an anti-reflection coating to the selenium layer.

9. The photovoltaic device described in claim 8 wherein the light reflected from the illuminated surface is less than about 10%.

10. The photovoltaic device described in claim 1 or 4 wherein said selenium layer is between 1 micron and about 5 microns in thickness.

11. The photovoltaic device of claim 10 wherein said selenium layer is between about 2 microns and about 3 microns in thickness.

12. A method for producing a photovoltaic device having a body of polycrystalline selenium and displaying a sunlight engineering efficiency in excess of about 3.5%, said method comprising:
   coating a transparent substrate with a pellucid layer of conductive oxide having a surface whose work function is below about 4.5 electron volts;
   depositing on said coated substrate a thin layer of tellurium to provide a bond between the oxide and the selenium;
   forming on said tellurium a layer of amorphous selenium having a thickness less than about five microns but sufficient to be substantially free of shorting paths therethrough;
   heat treating said amorphous selenium layer at a temperature above about 200° C. and sufficient to crystallize said layer and form a heterojunction between said oxide and said crystallized selenium layer, said selenium having a depletion region extending inwardly from said heterojunction in excess of about 1000 Anstroms;
   depositing on said crystallized selenium layer an electrode of a metal whose work function exceeds about 5.0 electron volts to provide an ohmic contact to said selenium layer.

13. The method of claim 11 wherein said substrate is heated to a temperature between about 200° C. and about 210° C.

14. The method of claim 13 wherein said substrate is heated to a temperature of about 210° C.

15. The method set forth in claim 12 wherein said selenium thickness is between about two and about three microns.

16. The method set forth in claim 12 wherein said steps of depositing and crystallizing the selenium layer includes a doping of a non-depletion region of said selenium layer with oxygen, tellurium, chlorine, or bromine to render same substantially conductive relative to said depletion region.

* * * * *